(12) United States Patent
Huang et al.

(10) Patent No.: US 12,451,876 B2
(45) Date of Patent: Oct. 21, 2025

(54) ASYNCHRONOUS CONTROL OF PHASE SHIFT USING AN INJECTION-LOCKED-OSCILLATOR-BASED PHASE ROTATOR

(71) Applicant: NVIDIA Corporation, Santa Clara, CA (US)

(72) Inventors: Yi-Chieh Huang, Zhubei (TW); Bo-Yu Chen, Taichung (TW); Po-Shuan Weng, Hsinchu (TW); Ying Wei, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 18/584,154

(22) Filed: Feb. 22, 2024

(65) Prior Publication Data
US 2025/0274109 A1    Aug. 28, 2025

(51) Int. Cl.
*H03K 5/01*      (2006.01)
*H03K 19/20*    (2006.01)
*H03K 5/00*      (2006.01)

(52) U.S. Cl.
CPC .............. *H03K 5/01* (2013.01); *H03K 19/20* (2013.01); *H03K 2005/00286* (2013.01)

(58) Field of Classification Search
CPC . H03K 5/01; H03K 19/20; H03K 2005/00286
USPC ........................................................ 327/231
See application file for complete search history.

(56) References Cited

U.S. PATENT DOCUMENTS

| | | | |
|---|---|---|---|
| 9,673,828 B1* | 6/2017 | Xu ............................. | H03L 7/24 |
| 10,044,359 B1* | 8/2018 | Kim ........................ | H03L 7/0995 |
| 11,356,107 B1* | 6/2022 | Bhat ....................... | H03L 7/085 |
| 2009/0175116 A1* | 7/2009 | Song ........................ | H03L 7/083 |
| | | | 365/233.12 |
| 2014/0043105 A1* | 2/2014 | Zerbe ...................... | H03K 5/133 |
| | | | 331/50 |
| 2015/0333760 A1* | 11/2015 | Zerbe ........................ | H03L 7/00 |
| | | | 331/25 |
| 2021/0152180 A1* | 5/2021 | Shin .......................... | H03L 7/24 |
| 2022/0140831 A1* | 5/2022 | van den Heuvel ... | H03L 7/0814 |
| | | | 327/158 |

* cited by examiner

*Primary Examiner* — Ryan Jager
(74) *Attorney, Agent, or Firm* — Lowenstein Sandler LLP (57) ABSTRACT

A circuit includes a phase selector to generate an injection clock signal having an injection phase based on a phase of a digitally controlled oscillator clock signal generated within a phase-locking feedback loop. An injection-locked oscillator (ILO), coupled to an output of the phase selector, generates an ILO clock signal that is convertible to provide a feedback clock signal of the circuit. Logic, coupled between an output of the ILO and the phase selector, to, at each predetermined number of cycles of the DCO clock signal, cause the phase selector to output a phase shift in the injection clock signal that causes the ILO clock signal to comprise a rotated phase, relative to the injection phase, and that prevents a glitch in the injection clock signal.

23 Claims, 10 Drawing Sheets

Inject, by the phase selector into the ILO, an injection clock signal having an injection phase based on a present phase of a digitally controlled oscillator (DCO) clock signal generated within a phase-locking feedback loop.
610

↓

Generate, by the ILO, an ILO clock signal.
620

↓

At each predetermined number of cycles of the DCO clock signal, cause the phase selector to output a phase shift in the injection clock signal that causes the ILO clock signal to include a rotated phase, relative to the injection phase.
640

ASYNCHRONOUS CONTROL OF PHASE SHIFT USING AN INJECTION-LOCKED-OSCILLATOR-BASED PHASE ROTATOR

TECHNICAL FIELD

At least one embodiment generally pertains to communications systems, and more specifically, but not exclusively, to asynchronous control of phase shift using an injection-locked-oscillator-based phase rotator.

BACKGROUND

In various circuitry where an output depends on phase and frequency timing, particularly that relies on a feedback clock signal of oscillator-based clock generation, a digital-to-time converter (DTC) may be employed to convert digital control signals to time or phase shifts. Such a DTC may be employed for fine-tuning and controlling a phase of an output signal of the circuitry, e.g., by modifying a phase detected by a phase detector at an input of the circuitry. In some cases, the circuitry is implemented within a phase-locked loop (PLL) circuit where the output signal phase is related to the input signal phase. Additional clock modification circuitry may be located between the phase detector and the generation of the feedback clock signal employed to help determine (and optionally lock onto in the case of the PLL circuit) the input phase and frequency of the overall circuit.

BRIEF DESCRIPTION OF DRAWINGS

Various embodiments in accordance with the present disclosure will be described with reference to the drawings, in which.

DETAILED DESCRIPTION

In some implementations of the circuits, devices, systems, and methods described herein is asynchronous control of phase shift using an injection-locked-oscillator-based phase rotator. In some implementations of the above-described circuitry, the additional clock modification circuitry may include a phase rotator designed to output the feedback clock signal either early or late to the phase detector in order to reduce phase delay differences and affects of noise. This noise, particularly in the context of receiver architecture of a receiving (RX) link device or other similar high-speed serializer/deserializer (SerDes) device, may be due to supply noise, delay drift, jitter, and phase skew. At higher frequencies and data rate speeds of communication, these types of noise and phase skew can create significant obstacles to scaling speed and throughput while retaining accuracy of data transfer that is clocked via such circuitry. Current approaches to removing or compensating for such noise and phase skew tend to be complicated, require too much area and power, and thus carry relatively high costs for implementation.

Aspects and embodiments of the present disclosure address the above deficiencies that result from noise and phase skew in generating clock signals by employing a particular phase rotator, e.g., in a phase-locking feedback loop, that provides a coarse phase adjustment while the above-discussed DTC provides a fine phase adjustment in tuning the output signal. In some embodiments, the disclosed phase rotator and corresponding control logic provide asynchronous control of phase shift designed to prevent or significantly reduce glitches at clock edges and adjust for phase skew.

In various embodiments, a circuit, device, or system with the disclosed phase rotator includes a phase selector to select a desired phase that is injected into an injection-locked oscillator (ILO) designed to lock the output to the selected phase, where the output may be the feedback clock signal or a signal that may be converted to the feedback clock signal. In this way, the control logic may asynchronously adjust the phase of the ILO to prevent a glitch that might otherwise occur particularly at edge transitions in the clock signal that become the feedback clock signal. Further, the control logic may sweep through inclusion of multiple phase shifts in the injection clock signal, causing a phase delay skew of the ILO clock signal to approximately average to zero.

More specifically, in some embodiments, the circuit, device, or system may include a phase selector configured to generate an injection clock signal having an injection phase based on a present phase of a digitally controlled oscillator (DCO) clock signal generated within the phase-locking feedback loop. The ILO may be coupled to an output of the phase selector and configured to generate an ILO clock signal that is convertible to provide the feedback clock signal of the circuit. In some embodiments, the feedback signal is provided to a phase detector that also receives a reference clock signal, e.g., from a DTC. Logic (e.g., control logic) may be coupled between an output of the ILO and the phase selector. In some embodiments, the logic detects causes, at each predetermined number of cycles of the DCO clock signal, the phase selector to output a phase shift in the injection clock signal that causes the ILO clock signal to include a rotated phase, relative to the injection phase, that substantially prevents a glitch in the injection clock signal. If a small residual glitch still occurs, the ILO may function as a PLL and low-pass filter to further reduce the glitch before generating the feedback clock signal.

In other or related embodiments, the circuit, device, or system includes a reference oscillator that generates an output clock signal based on an input current. A level shifter may be coupled to the reference oscillator and configured to generate, from the output clock signal, a DCO clock signal. A phase selector may be coupled to the level shifter and configured to generate an injection clock signal having an injection phase based on a present phase of the DCO clock signal. An ILO may be coupled to an output of the phase selector and configured to generate an ILO clock signal that is convertible to provide the feedback clock signal of the circuit. Logic may be coupled between an output of the ILO and the phase selector and configured to cause the phase selector to sweep through inclusion of multiple phase shifts in the injection clock signal, causing a phase delay skew of the ILO clock signal to approximately average to zero (e.g., enable phase skew suppression). Because the phase delay changes may cause the divide number of a clock divider, which is coupled to the output of the ILO, to vary, the logic may further be configured to provide the divide number to the clock divider so that the feedback signal accurately matches up, in phase and frequency, with the input reference signal.

Therefore, advantages of the circuits, devices, systems, and methods implemented in accordance with some embodiments of the present disclosure include, but are not limited to, preventing, or at least minimizing, glitches or other noise in generating the feedback clock signal of a phase-locking feedback loop. Further, phase skew may be suppressed in the feedback clock signal by varying the phase shift in an ILO of a phase rotator. Other advantages will be apparent to those skilled in the art of oscillator-based clock generation, as will be discussed hereinafter.

Figure 1:
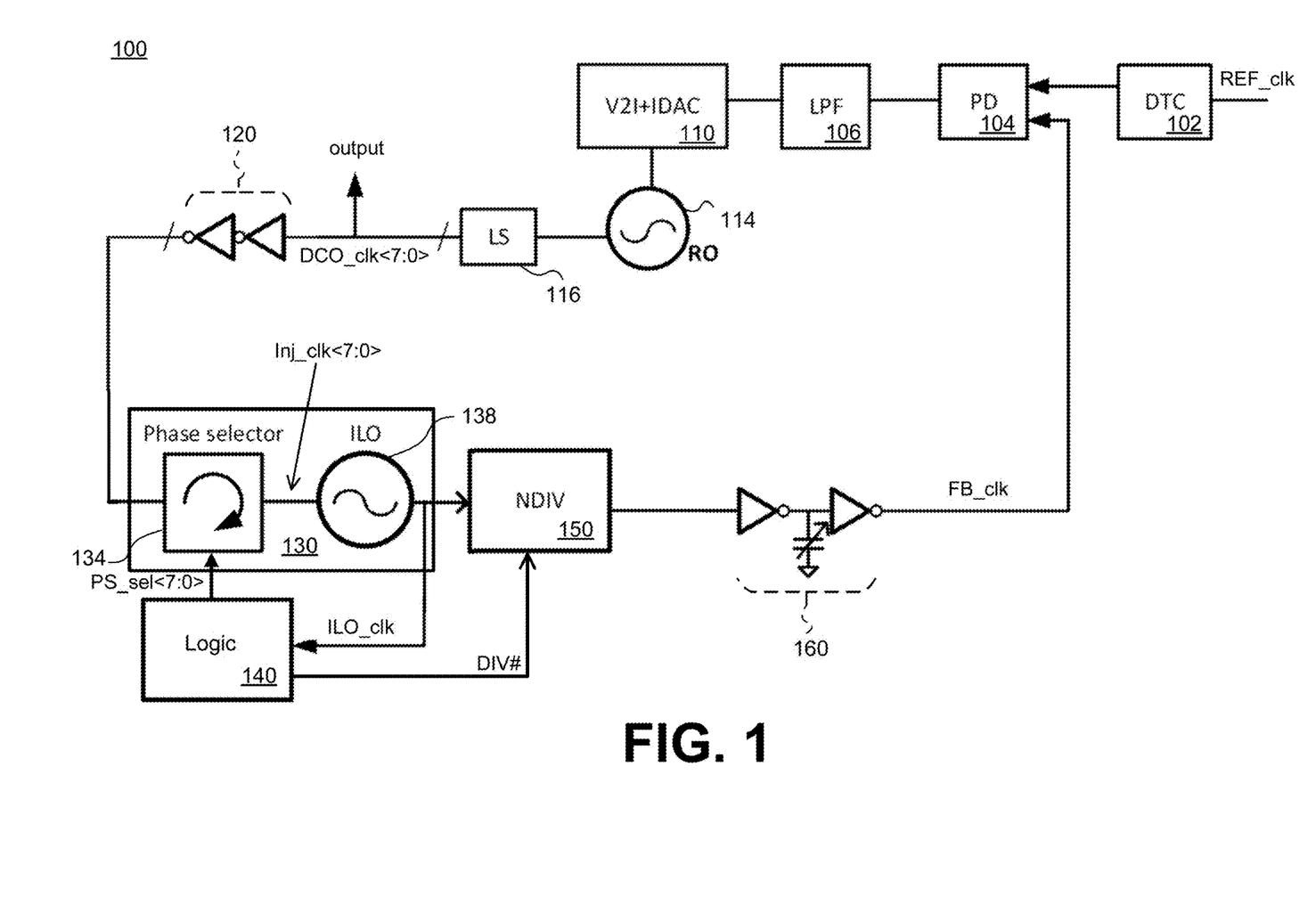
FIG. 1 is a schematic block diagram of an example circuit (or system) according to asynchronous control of phase shift using an injection-locked-oscillator-based phase rotator various embodiments.

FIG. 1 is a schematic block diagram of an example circuit 100 (or system) according to asynchronous control of phase shift using an injection-locked-oscillator-based phase rotator various embodiments. In some embodiments, the circuit 100 is a PLL circuit that may be optionally integrated within an RX receiver, e.g., of a high-speed SerDes device of the like. The circuit may be implemented within other phase-locking feedback loops or timing circuitry intended to remove phase and/or frequency error, e.g., in oscillation-based clock generation.

In various embodiments, the circuit 100 includes a digital-to-time converter or DTC 102, a phase detector or PD 104, a low-pass filter or LPF 106, a voltage-to-current digital-to-analog converter 110, a reference oscillator 114, a level shifter 116 to generate an output signal for the circuit 100, an optional DCO buffer 120, a phase rotator 130, an N-way clock divider 150 (e.g., divide by N divider), and an optional feedback buffer 160, all generally coupled together, as illustrated. In some embodiments, the circuit 100 further includes logic 140 coupled between an output of the ILO 138 and the phase selector 134, which will be discussed more hereinafter. In some embodiments, the N-way clock divider 150 and the optional feedback buffer 160 provide a feedback clock signal (FB_clk) to the PD 104. In some embodiments, the phase rotator 130 includes a phase selector 134 and an injection-locked oscillator or ILO 138. In embodiments, the phase selector 134 selects a desired phase that is injected into the ILO 138, which is designed to lock its output to the selected phase, where the output may be the feedback clock signal or a signal that may be converted to the feedback clock signal, as will be explained.

In some embodiments, a phase-locking feedback loop of the circuit 100 includes the components coupled between the reference oscillator 114 and the PD 104. In varying embodiments, the reference oscillator 114 is a voltage-controlled oscillator (VCO) such as a ring oscillator (RO), an inductor-capacitor (LC) oscillator, a crystal oscillator, a surface acoustic wave (SAW) oscillator, an yttrium iron garnet (YIG) oscillator, or the like. Where some of these oscillators output analog signals, the level shifter 116 may convert the analog signal to a digital signal, e.g., through employing a Schmitt trigger, a comparator circuit, or the like.

In some embodiments, the DTC 102 converts digital control signals into time or phase shifts, e.g., as a way of fine-tuning and controlling the phase of the output signal of the circuit 100. In the context of an RX PLL system, for example, the DTC 102 may be adjusted to cause the phase of the reference oscillator 114 to be adjusted. Such an adjustment may be useful in applications where precise timing and phase alignment are expected, such as in high-speed data communication and signal processing. While the PLL (or similar) circuit locks the frequency of the reference oscillator 114 to the frequency of the input signal, the DTC 102 may allow for fine-tuning of the phase, providing an additional layer of control.

For example, in various embodiments, the DTC 102 receives a digital input (such as a reference clock—REF_clk), which represents desired phase shift or timing adjustments. The DTC 102 may then convert these digital inputs into corresponding time delays, thus adjusting the timing of the output of the reference oscillator 114, e.g., the output signal. This process allows for precise control over the phase of the output signal, which may enable synchronization with an incoming signal of the RX (or other communication) circuitry. For example, DTCs are particularly useful in communication systems where synchronization of data transmission and reception is required for accurate end-to-end data transmissions. DTCs may further be used in applications that require high-resolution phase adjustment, such as in radar systems, signal processing, and various forms of wireless communications.

In at least some embodiments, the PD 104 compares the output of the DTC 102 (e.g., encoded time delays) with the feedback clock signal (FB_clk) to generate (or output) an error signal that quantifies an error between the phase of the input reference clock and that of the feedback clock signal. The LPF 106 may low-pass filter the error signal to clean up the error signal before the error signal passes to current-generating circuitry such as the voltage-to-current digital-to-analog converter 110. The converter 110 may convert the filtered error signal to a digital current signal that is then converted to an analog current signal (e.g., to a current) that drives the reference oscillator 114.

In at least some embodiments, the reference oscillator 114 generates an output clock signal based on the current and the DCO level shifter 116 amplifies (or otherwise shifts) the output clock signal as a DCO clock signal (DCO_clk<7:0>) that is useable in the circuit 100 and/or may be exported for use to a coupled circuit, whether on or off chip. For example, the DCO clock signal may be employed in an analog-todigital converter (ADC) used to sample data lanes of an RX transceiver of a SerDes device in at least one embodiment.

In some embodiments, the optional DCO buffer 120 includes a pair of inverters coupled between the level shifter 116 and the phase selector 134. The pair of inverters (or other number of inverters) may delay the DCO output signal by a predetermined discrete time delay to provide sufficient time for the phase selector 134 to act on the DCO clock signal. Although the DCO clock signal and other clock signals referenced herein are illustrated to have eight possible phases (e.g., <7:0>), this is for purposes of explanation only and any number of possible phases are envisioned, such as 8, 16, 24, 32, or the like.

In varying embodiments, the phase selector 134 is configured to generate an injection clock signal (Inj_clk<7:0>) having an injection phase based on a present phase of the DCO clock signal generated within the above-referenced phase-locking feedback loop. The ILO 138 may be coupled to an output of the phase selector 134 and configured to generate an ILO clock signal (ILO_CLK) that is convertible to provide a feedback clock signal of the circuit 100. In embodiments, the logic 140 is configured to, at each predetermined number of cycles, cause the phase selector to output a phase shift in the injection clock signal that causes the ILO clock signal to include a rotated phase, relative to the injection phase, and that substantially prevents a glitch (see FIG. 5).

In some embodiments, the logic 140 is also employed to cause the phase selector 134 to sweep through inclusion of multiple phase shifts in the injection clock signal, causing a phase delay skew of the ILO clock signal to approximately average to zero. For example, the sweep through the multiple phase shifts may incrementally (or decrementally) output a larger phase shift of the multiple phase shifts (e.g., through the different possible phases such as indicated by <7:0>) until sweeping through each possible phase shift in sequential cycles of the DCO clock signal, and then starting over again at the lowest phase shift (see FIG. 8).

In some embodiments, therefore, the phase rotator 130 is configured to provide a coarse phase adjustment to the feedback clock signal (FB_clk) while the DTC 102 provides a fine-tuned adjustment to DCO clock signal that trickles through to also fine-tune the feedback clock signal. In other words, changes to phase of the output clock signal due to changes in the reference input clock signal are smaller than an amount of each respective phase shift imparted, of the multiple phase shifts, to the ILO clock signal.

In some embodiments, the clock divider 150 is coupled to an output of the ILO 138 and configured to generate a digital feedback clock signal (FB_clk) from the ILO clock signal. The optional feedback buffer 160 may include another pair of inverters and a variable capacitor coupled between the pair of inventors to hold and provide the feedback clock signal from the clock divider 150 to the PD 104.

Figure 2A:
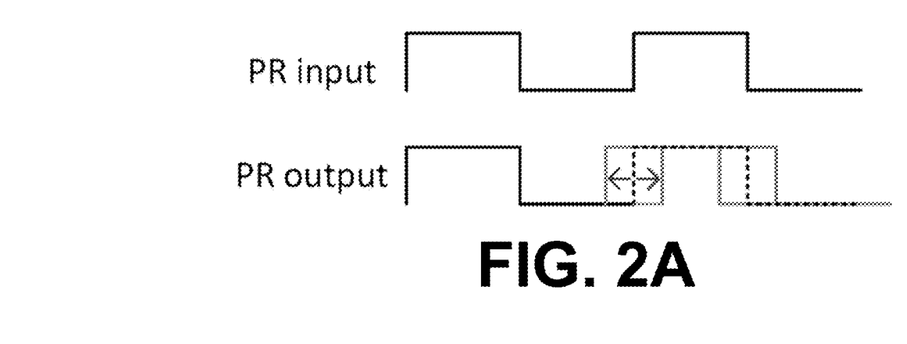
FIG. 2A is a graph of possible phase rotator output phase shifts in view of a phase rotator input, according to various embodiments.

FIG. 2A is a graph of possible phase rotator output phase shifts in view of a phase rotator input, according to various embodiments. For example, the first plot in the graph is of a phase rotator (PR) input into the phase rotator 130. As illustrated, a PR output of the phase rotator 130 may be made to vary in phase at some point in order to avoid glitches (or other noise) and/or in being swept through predetermined phase shifts so as to average out skew.

Figure 2B:
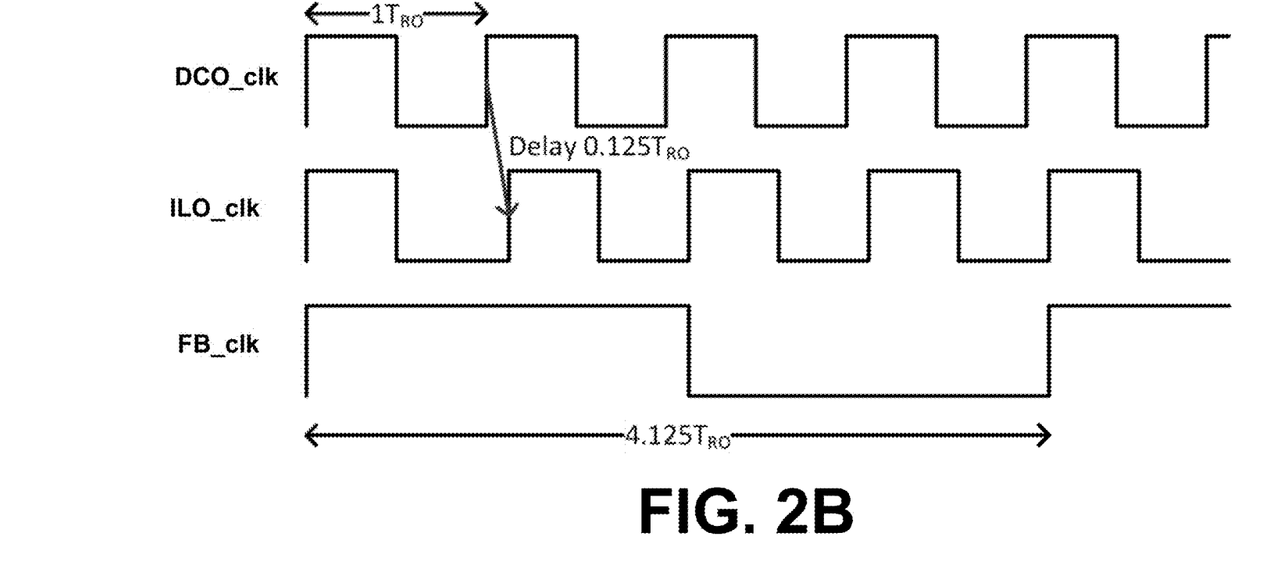
FIG. 2B is a timing diagram of the circuit of FIG. 1, comparing a digitally controlled oscillator clock signal (DCO_clk), an injection-locked oscillator clock signal (ILO_clk), and a feedback clock signal (FB_clk), according to some embodiments.

FIG. 2B is a timing diagram of the circuit 100 of FIG. 1, comparing a digitally controlled oscillator clock signal (DCO_clk), an injection-locked oscillator clock signal (ILO_clk), and a feedback clock signal (FB_clk), according to some embodiments. The example of FIG. 2B is an implementation of the circuit 100 when the N-way clock divider 150 has an N of four ("4") for purposes of illustration. A single clock cycle (having a clock period) is illustrated as $1T_{RO}$ and a delay, which is illustrated as a single phase shift in the ILO signal, may be one-eighth (or, more generally, an Nth) of the clock period of the reference oscillator 114 (or $0.125T_{RO}$) where the phases are partitioned into eight (or N) discrete phases (illustrated only by way of example herein). As illustrated, this phase shift in the ILO clock signal slightly changes the timing of the start of that clock cycle and each of the subsequent clock cycles (absent another phase shift bringing the start point back, eliminating the original phase shift). After the N-way divider 150 acts on the ILO clock signal (e.g., the output of the phase rotator 130), the feedback clock signal (or FB_clk) may have a slightly longer clock cycle by an eighth of the DCO clock signal period, e.g., $4.125T_{RO}$.

Figure 3:
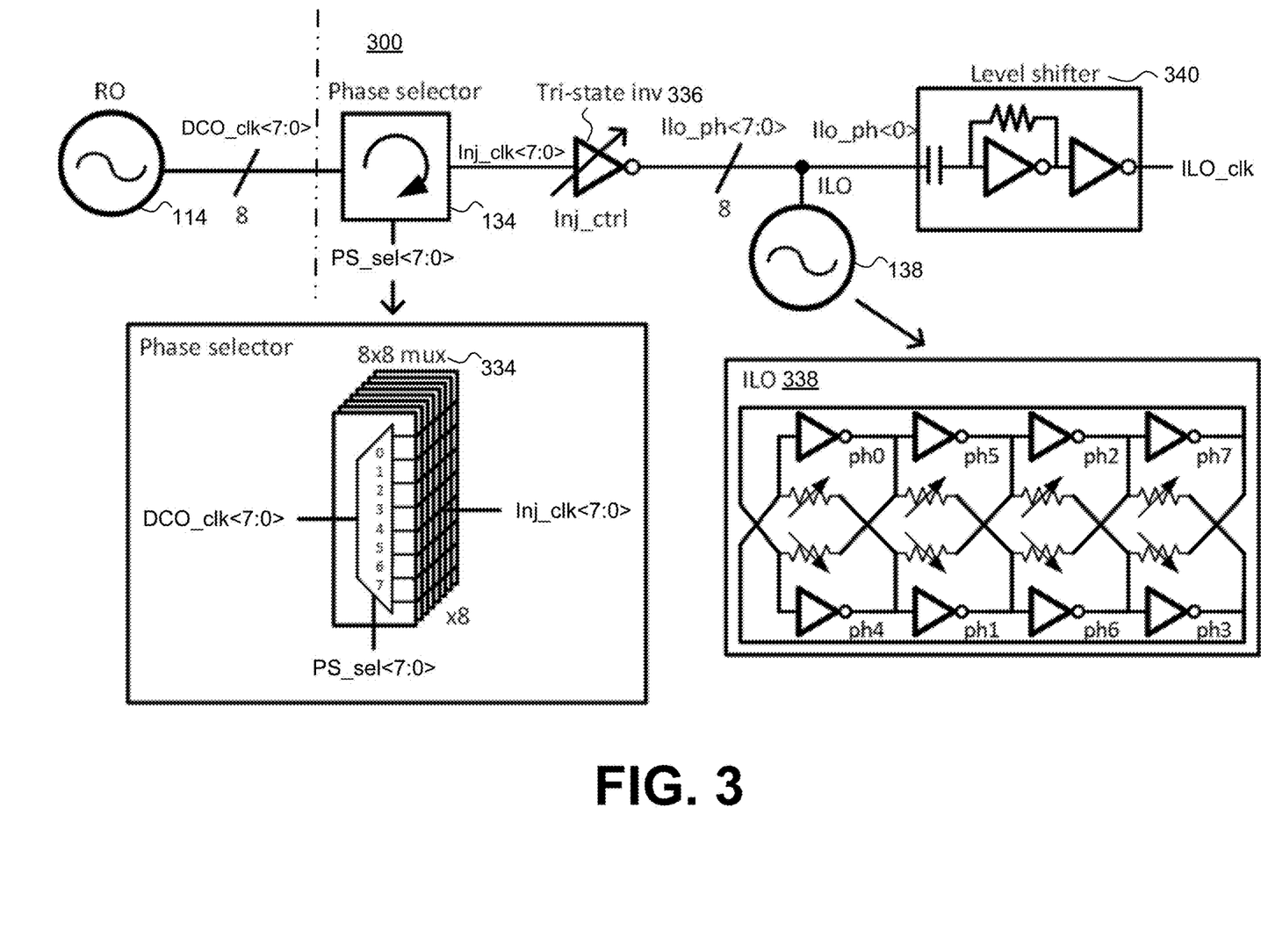
FIG. 3 is a more-detailed implementation of the circuit (or system) of the phase rotator of FIG. 1 according to at least one embodiment.

FIG. 3 is a more-detailed implementation of the circuit 300 (or system) of the phase rotator 130 of FIG. 1 according to at least one embodiment. In some embodiments, the circuit 300 includes the phase selector 134, the ILO 138, a tri-state inverter 336 coupled between the phase selector 134 and the ILO 138, and a level shifter 340 coupled to an output of the ILO 138. Various clock signals are also identified between these components, which will be referred to hereinafter in various Figures.

Figure 5:
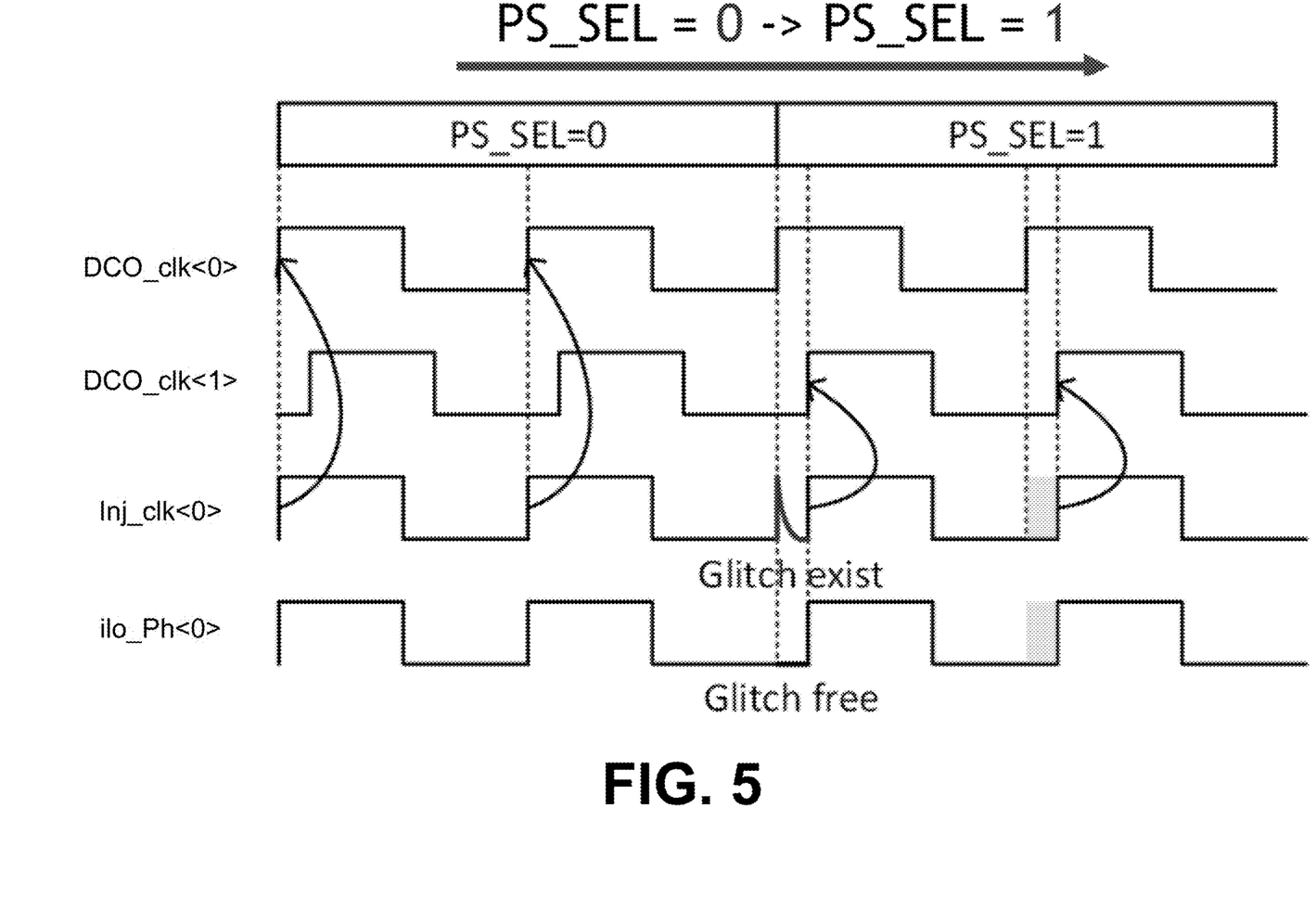
FIG. 5 is a timing diagram of DCO clock timing and injection clock timing to substantially prevent a glitch in the injection clock signal fed to the ILO, according to at least some embodiments.
Figure 6:
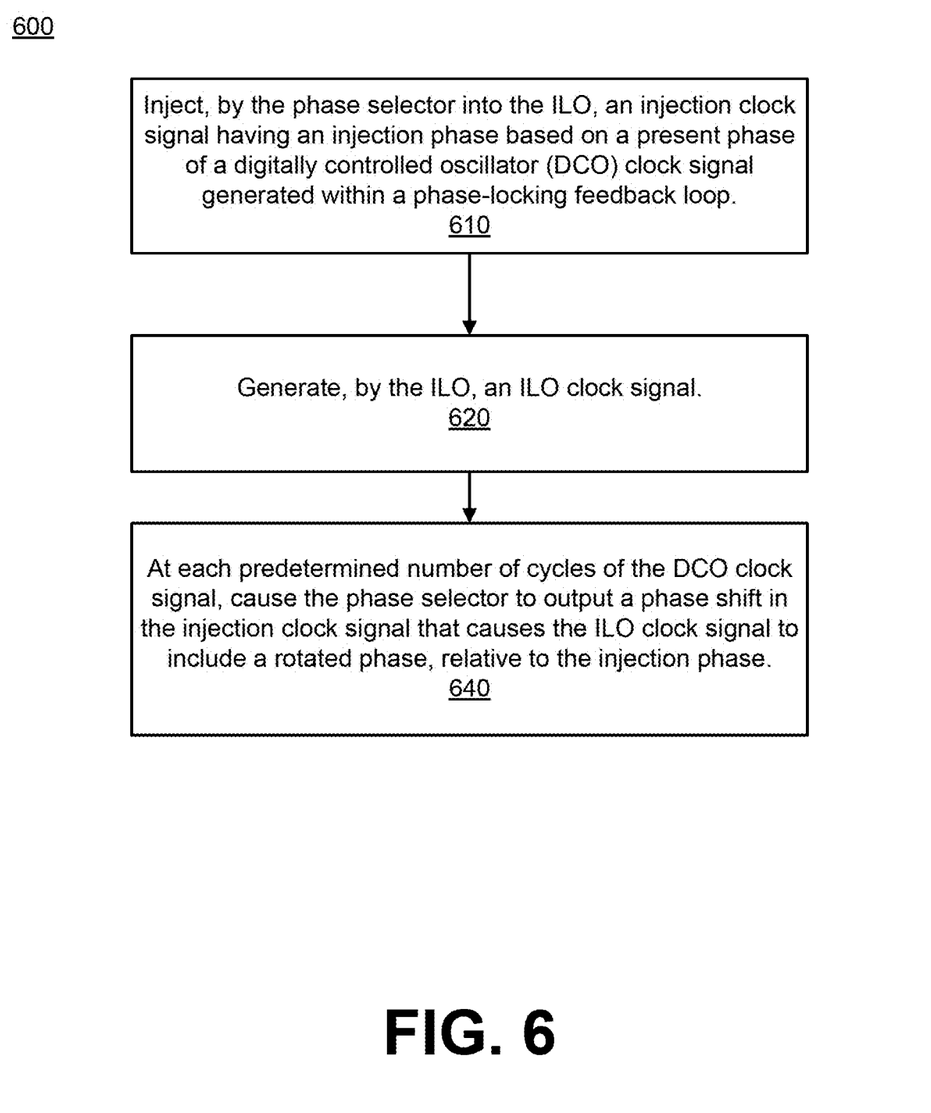
FIG. 6 is a flow chart of an example method for operating asynchronous control of phase shift using an injection-locked-oscillator-based phase rotator according to at least one embodiment.
Figure 7:
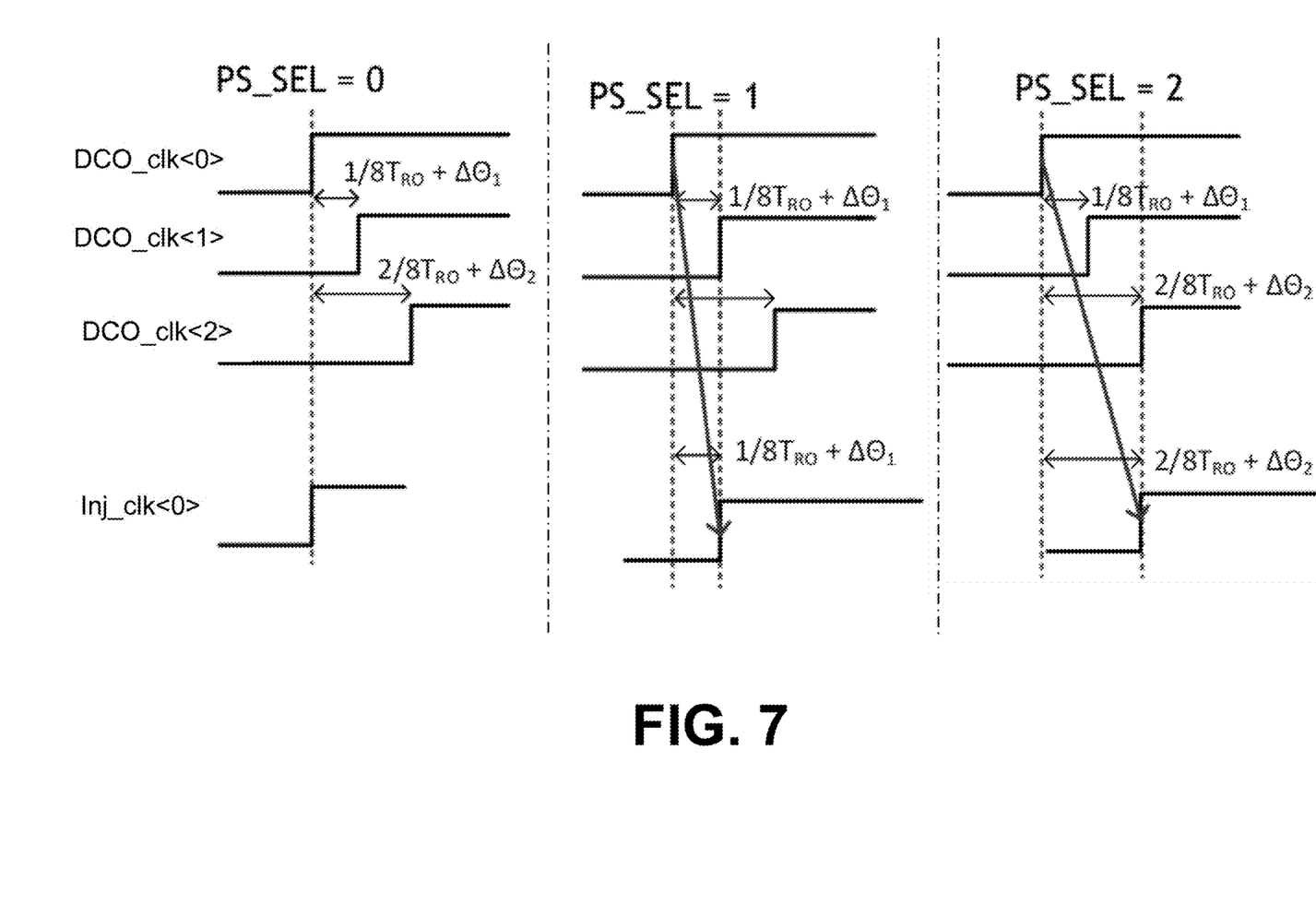
FIG. 7 are sets of timing diagrams illustrating possible phase shifts between selected states of the phase selector, according to some embodiments.

In some embodiments, the phase selector 134 is or includes a multiplexer 334 that maps multiple input states, corresponding to multiple phases of the DCO clock signal (DCO_clk), to multiple output states corresponding to injection phases of the injection clock signal (Inj_clk). For example, a mapped output state of the multiple output states may cause the ILO 138 to output the ILO clock signal (ILO_clk) with a rotated phase including one or more discrete time shifts, as illustrated in FIGS. 5-7. In some embodiments, the multiple phases are illustrated as eight phases, and thus each discrete time shift may include an eighth of a clock period of the DCO clock signal (DCO_clk). In other embodiments, as mentioned, the multiple phases may include other number of phases, such as sixteen phases, in which case each discrete time shift may include a sixteenth of a clock period of the DC clock signal (DCO_clk).

Figure 4:
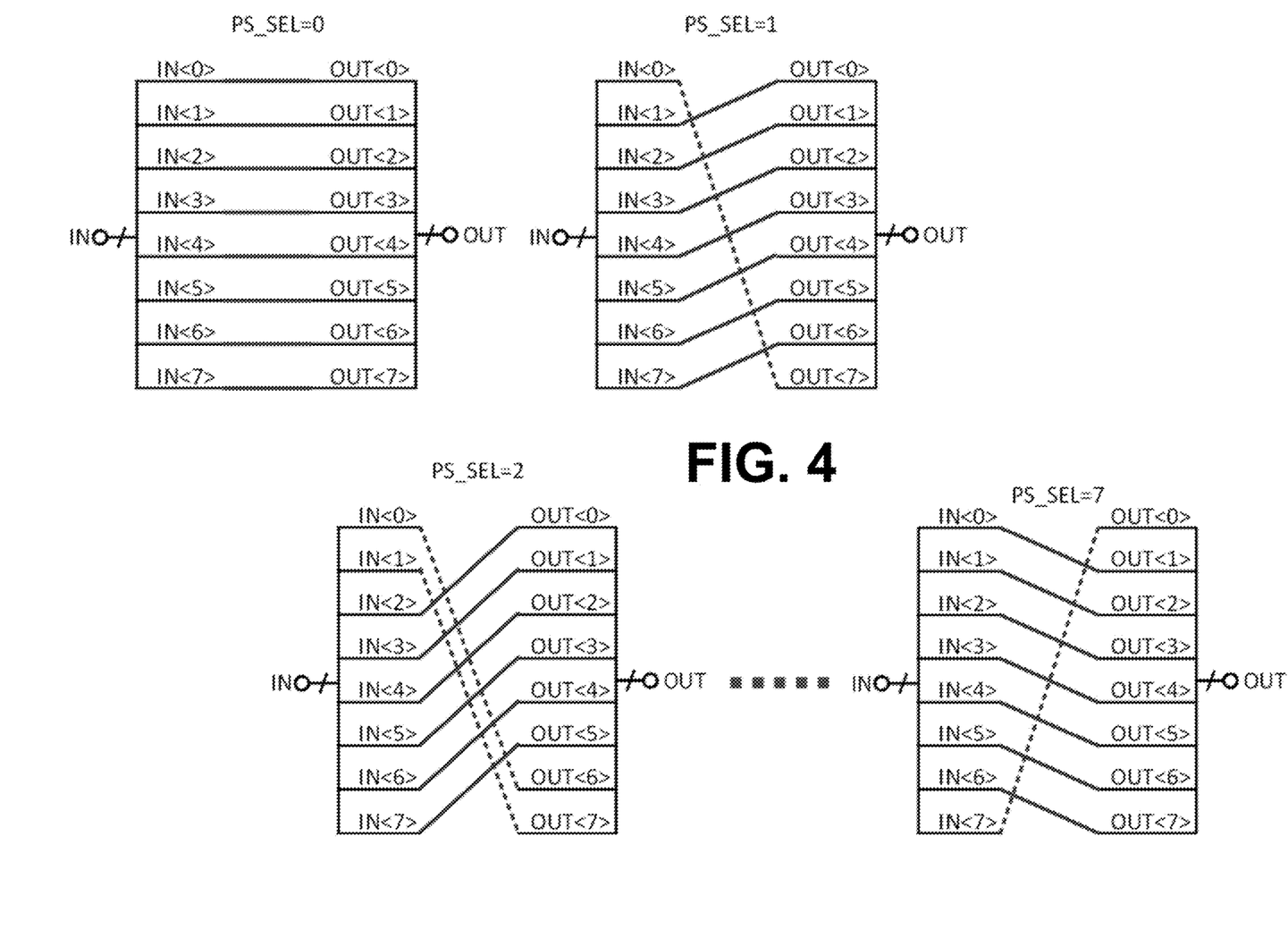
FIG. 4 is a set of phase selector states illustrating possible phase shifts performable by a phase selector before the clock signal is injected into the ILO, according to some embodiments.

With continued reference to FIG. 1 and FIG. 3, FIG. 4 is a set of phase selector states illustrating possible phase shifts performable by a phase selector 134 (e.g., the multiplexer 334) before the clock signal is injected into the ILO 138, according to some embodiments. Only by way of example, the logic 140 may output a phase selector signal (PS_sel<7:0>), which may be any of eight different signal values that selects, as an enable single to the multiplexer 334, one of the multiple output states of the multiplexer 334. As discussed previously, corresponding to different phase shifts, the phase selector signal may also be of 16, 24, 32, or the like values.

As illustrated in FIG. 4, various mappings may be performed of which a phase selection signal value of zero, one, two, and seven are illustrated only by way of example for purposes of explanation. In various embodiments, a phase selection signal value of zero causes no phase shift, a phase selection signal of one causes an eighth period phase shift (e.g., IN<0> to OUT<7>, IN<1> to OUT<0>, and so forth), a phase selection signal of two causes a combination of two phase discrete time shifts to include a fourth of a clock period in phase shift (e.g., IN<0> to OUT<6>, IN<1> to OUT<7>, IN<2> to OUT<0>, and so forth), and a phase selection signal of seven causes an eighth of a clock period in phase shift with different mappings (e.g., IN<0> to OUT<1>, IN<1> to OUT<2>, and so forth). In some embodiments, each phase shift is approximately the same and combining different phase shifts causes a multiple of each phase shift in time delay, although imparting incremental (or decremental) phase shifts that step through the phase selection signal values may have the cumulative effect of a multiple phase shift. Phase shifts are expressed at the injection clock signal (Inj_clk<7:0>) to be injected into the ILO 138, causing phase rotation in the ILO output signal. Table 1 is a more complete example of possible mappings between different inputs (e.g., Inj_clk<7:0>) and outputs (ilo_pho<7:0>) based on the phase selection signal values (PS_SEL), e.g., as an extension to the examples of FIG. 4.

TABLE 1

| PS_SEL | IN<0> | IN<1> | IN<2> | IN<3> | IN<4> | IN<5> | IN<6> | IN<7> |
|---|---|---|---|---|---|---|---|---|
| 0 | OUT<0> | OUT<1> | OUT<2> | OUT<3> | OUT<4> | OUT<5> | OUT<6> | OUT<7> |
| 1 | OUT<7> | OUT<0> | OUT<1> | OUT<2> | OUT<3> | OUT<4> | OUT<5> | OUT<6> |
| 2 | OUT<6> | OUT<7> | OUT<0> | OUT<1> | OUT<2> | OUT<3> | OUT<4> | OUT<5> |
| 3 | OUT<5> | OUT<6> | OUT<7> | OUT<0> | OUT<1> | OUT<2> | OUT<3> | OUT<4> |
| 4 | OUT<4> | OUT<5> | OUT<6> | OUT<7> | OUT<0> | OUT<1> | OUT<2> | OUT<3> |
| 5 | OUT<3> | OUT<4> | OUT<5> | OUT<6> | OUT<7> | OUT<0> | OUT<1> | OUT<2> |
| 6 | OUT<2> | OUT<3> | OUT<4> | OUT<5> | OUT<6> | OUT<7> | OUT<0> | OUT<1> |
| 7 | OUT<1> | OUT<2> | OUT<3> | OUT<4> | OUT<5> | OUT<6> | OUT<7> | OUT<0> |

In some embodiments, the ILO 138 is implemented as an ILO 338 illustrated inset within FIG. 3. For example, this particular ILO 338 may include sets of inverters that are cross-coupled with variable resistors. Each output of an inverter has an incrementally different (e.g., larger) phase delay that is output from the ILO 338 in response to a different injected clock phase in the injection clock signal.

In various embodiments, the tri-state inverter 336 adjusts an injection strength of the injection clock signal before being injected into the ILO 338. An output of the tri-state inverter 336 for clarity within the Figures is illustrated as ilo_ph<7:0>. That said, the phase of the ilo_ph<7:0> generally matches that of the injection clock signal (Inj_clk<7:0>).

In some embodiments, the level shifter 340 converts the ILO clock signal to a voltage domain of the feedback clock signal (e.g., FB_clk). In embodiments, the level shifter 340 includes a capacitor serially coupled to a serially-coupled pair of inverters and a resister coupled between the capacitor and a node between the serially-coupled pair of inverters. In some embodiments, the clock divider 150 (FIG. 1) is coupled to an output of the level shifter 340 and generates the feedback clock signal (FB_clk) from the ILO clock signal output by the level shifter 340. In embodiments, the phase delay changes cause the divide number of the clock divider 150 to vary. Thus, the logic 140 may further be configured to provide a divide number (DIV #) to the clock divider 150 that varies with a state corresponding to a selected phase shift of the multiple phase shifts coming from the phase rotator 130. In this way, the feedback signal can be made to accurately match up, in phase and frequency, with the input reference signal.

FIG. 5 is a timing diagram of DCO clock timing and injection clock timing to substantially prevent a glitch in the injection clock signal fed to the ILO, according to at least some embodiments. In some embodiments, according to the illustrated example, the logic 140 causes the phase selector signal (PS_SEL) to transition from zero ("0") to one ("1"), causing a phase shift (e.g., a time delay) of an eighth of a clock period of the DCO clock signal. For example, the injection clock signal may transition from OUT<0> to OUT<7>, as illustrated when comparing the output for IN<0> between the phase selection signal value changing from zero to one in FIG. 4. In some embodiments, the phase shift is changed by incrementing (or decrementing) the phase selection signal value (PS_SEL) at each predetermined number of cycles of the DCO clock signal, e.g., at each two cycles, four cycles, six cycles, or eight cycles, or the like, depending on tending of the circuit 100 to incur phase delay as clock signals propagate through different stages. As illustrated, a glitch may occur if the DCO clock signal and the injection clock signals transition at a clock edge at a different time, even if only off by a small phase shift. Thus, by changing the phase shift at each certain number of clock cycles, e.g., asynchronously, such glitches expected at clock transitions can be avoided or at least significantly minimized.

In this way, after the phase shift caused by phase selection of the multiplexer 334, a phase of the injection clock signal may now correspond to that of the DCO clock signal having a second phase value (e.g., DCO_clk<1>) in which the start of the next clock cycle in the injection clock signal substantially prevents a glitch at the DCO clock signal edge for the first phase value (e.g., of DCO_clk<0>). As a result, the output of the tri-state inverter 336 is illustrated as ilo_ph<0> and is glitch-free. Thus, in some embodiments, the logic 140 is a finite state machine (FSM) configured to change, at each predetermined number of cycles of the DCO clock signal, a phase shift selector input to the multiplexer 334 that causes a percentage phase shift in a clock period of the injection clock signal, which avoids (or substantially reduces) glitches. With eliminating or substantially reducing glitches in the injection clock signal, the ILO clock signal that results when injected with the injection clock signal is also substantially glitch free, e.g., before the buffer 160 captures the feedback clock signal to be provided back to the PD 104. In embodiments, the ILO 138 can filter out any remaining glitch (or related noise), as the ILO 138 can be configured as an N=1 PLL with a loss-pass-filter nature to phase locking.

FIG. 6 is a flow chart of an example method 600 for operating asynchronous control of phase shift using an injection-locked-oscillator-based phase rotator according to at least one embodiment. The method 1000 can be performed by components of a timing circuit such as the circuit 100 of FIG. 1. Further, these components could be or include those of a phase-locking feedback loop of the circuit 100, at least a portion of which is discussed with reference to the circuit 300 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the method includes injecting, by the phase selector 134 into the ILO 138, an injection clock signal having an injection phase based on a present phase of a digitally controlled oscillator (DCO) clock signal generated within the phase-locking feedback loop, e.g., of the DCO_clk.

At operation 620, the method includes generating, by the ILO 138, an ILO clock signal. In some embodiments, the ILO clock signal is convertible to provide a feedback clock signal of the circuit 100.

At operation 630, the method includes causing, by the logic 140, at each predetermined number of cycles of the DCO clock signal, the phase selector 134 to output a phase shift in the injection clock signal that causes the ILO clock signal to include a rotated phase, relative to the injection phase. In some embodiments, causing the phase selector to output the phase shift in the injection clock signal further prevents a glitch in the injection clock signal. In some embodiments, the logic 140 includes a finite state machine configured to change, at each of the predetermined number of cycles of the DCO clock signal, a phase selection signal value provided to the phase selector that causes a percentage phase shift in a clock period of the injection clock signal. This change in the phase selection signal value, in some embodiments, is performed incrementally, decrementally, or randomly such that all phases are covered.

FIG. 7 are sets of timing diagrams illustrating possible phase shifts between selected states of the phase selector, according to some embodiments. As illustrated in FIG. 7, due to a clock skew between the DCO clock signal (DCO_clk) and the injection clock signal (Inj_clk) of the same phase, a phase delay integral non-linearity (INL) may be created between these two clock signals. An INL, in disclosed embodiments, means a measurement of the deviation between an ideal output value (e.g., for the Inj_clk signal) and the actual measured output value. As illustrated examples, these phase delay INL values are represented as $\Delta\theta_1$-$\Delta\theta_7$ for eight different phases of the DCO clock signal and the injection clock signal, where the phase for the injection clock signal may be altered by discrete phase shifts, e.g., an eighth of a cycle ($\frac{1}{8}T_{RO}$) according to the phase selection signal value (PS_SEL).

Only by way of example, when the PS_SEL value transitions from zero to one, the injection clock signal shifts by an eighth of a clock period of the DCO clock signal but also includes an additional first phase delay INL value ($\Delta\theta_1$) from this phase shift. Similarly, when the PS_SEL value transitions from one to two, the injection clock signal shifts by a fourth of a clock period but also includes an additional second phase delay INL value ($\Delta\theta_2$) from this phase shift. Because, for example, these first and second phase delay INL values can vary, variable phase shift moving through the phase rotator 130 may cause timing inaccuracies in the feedback clock signal (FB_clk) if not processed to be removed (see FIG. 8).

Figure 8:
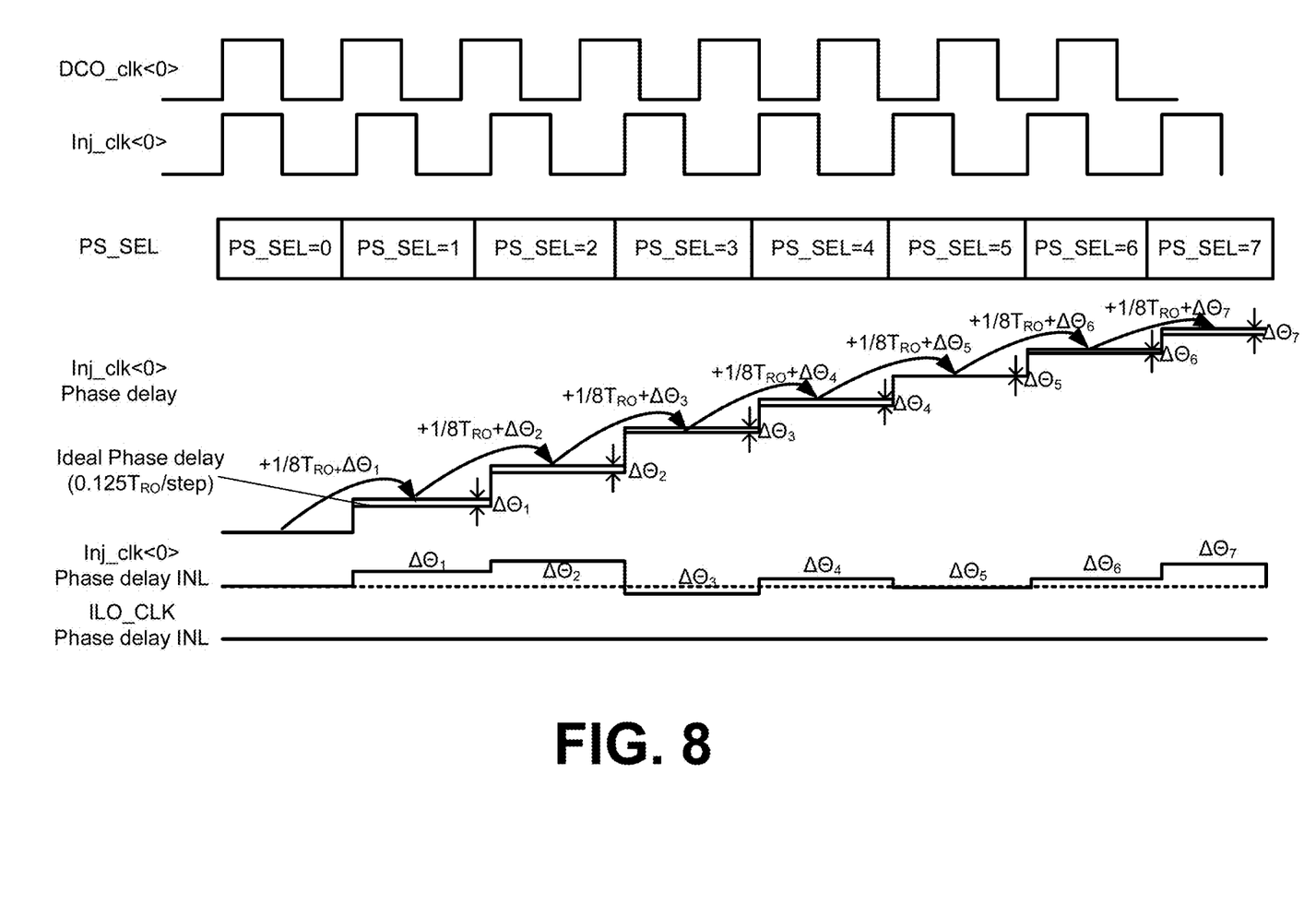
FIG. 8 is a timing diagram illustrating phase delay averaging to remove phase delay integral non-linearity (INL) in the circuit (or system) according to some embodiments.

FIG. 8 is a timing diagram illustrating phase delay averaging to remove skew in the circuit (or system) according to some embodiments. In embodiments, the logic 140 is configured to cause the phase selector 134 to sweep through inclusion of multiple phase shifts in the injection clock signal (Inj_clk<7:0>), causing a phase delay INL of the ILO clock signal to approximately average to zero. For example, the logic 140 may be a finite state machine (FSM) that causes the phase selection signal value (PS_SEL) to sweep through different possible values for different clock cycles, which causes the phase shift to also variably change across those different clock cycles.

In some embodiments, the sweep through the multiple phase shifts incrementally (or decrementally) outputs a larger phase shift of the multiple phase shifts (e.g., by adding or subtracting another+$\frac{1}{8}(T_{RO})$ time shift during each sequential clock cycle) until sweeping through each possible phase shift in sequential cycles of the DCO clock signal, and then starting over again at the first phase shift. These sequential phase shifts may be observed in the Inj_clk<0> phase delay plot of the timing diagram of FIG. 8 while the consequent injection clock signal (Inj_clk<0>) phase delay INL is illustrated as the bottommost plot of the timing diagram. As can be observed, the phase delay INL also variably changes with the variably changing phase shifts, causing a corresponding variable injection clock signal. As a result of sweeping through each phase selector signal value, the ILO 138 may output an ILO clock signal in which the phase delay INL approximately averages to zero, as illustrated in the ILO_clk<0> phase delay INL plot at the bottom of the timing diagram. While the illustrated example increases stepwise to sequentially larger phase shifts (e.g., by an eighth of a clock period of the DCO clock signal), the disclosed embodiments could be implemented in stepwise smaller phase shifts, random phase shifts, or some other sequence that generally steps through each phase selection signal value.

Figure 9:
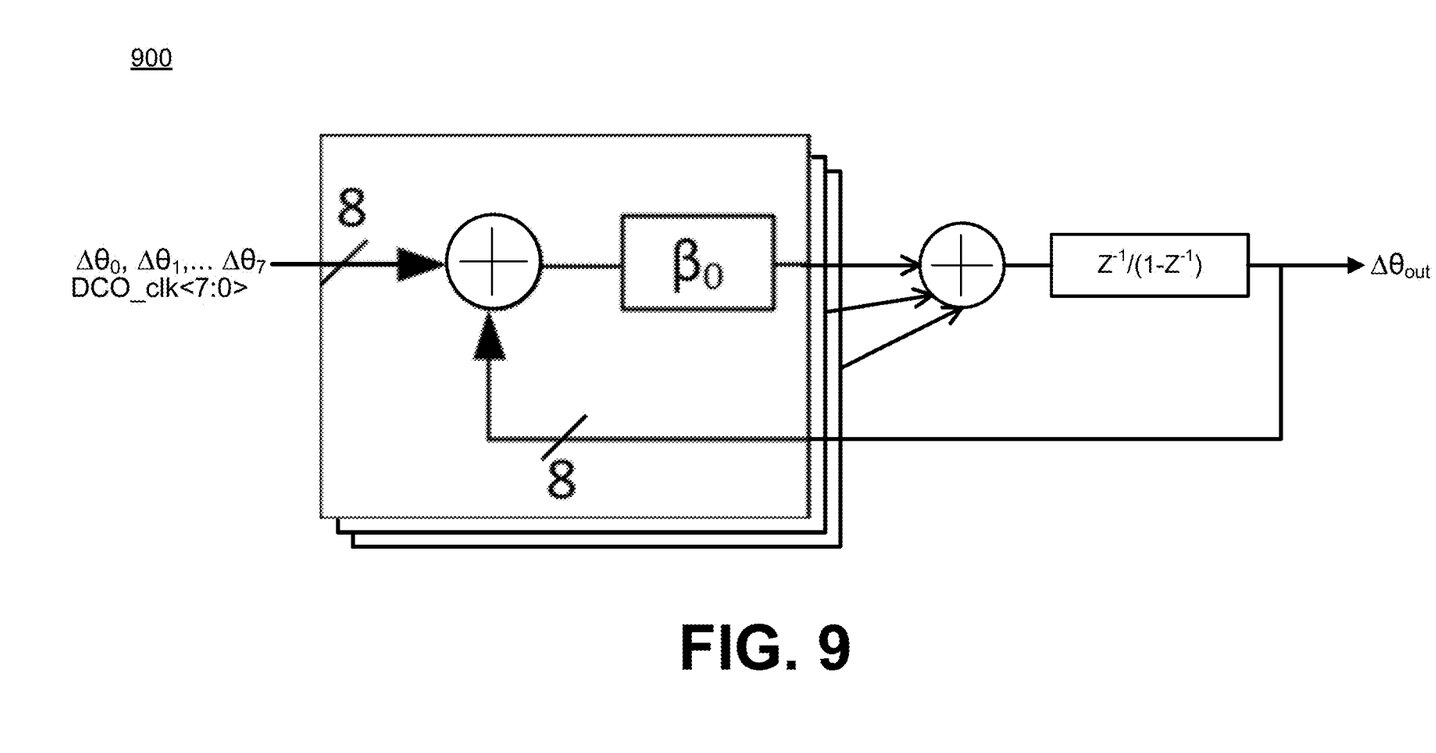
FIG. 9 is an operational model of the ILO to illustrate phase skew suppression of the discussed phase rotator according to some embodiments.

FIG. 9 is an operational model 900 of the ILO 138 to illustrate phase skew suppression of the discussed phase rotator 130 according to some embodiments and as discussed with reference to FIG. 8. As illustrated, the operational model 900 includes eight phased injections derived from the DCO clock signal (DCO_clk<7:0>), which include a respective phase skew value or phase error ($\Delta\theta_1$-$\Delta\theta_7$), each modulated with a respective $\beta$ value (magnitude of the phase skew or phase error). Along with an eight-phase feedback from the ILO clock signal (output of the ILO 138), the output of each phased injection is further combined and then modulated by $Z^{-1}/(1-Z^{-1})$, which generates the following list of output equations. These output equations are expressed as a combination of scaled input phase skews (or phase errors) depending on the phase selection signal value (e.g., phase selector state).

$\Delta\theta_{out(PS\_sel=0)} =$
$\frac{0}{8}*2\pi + \beta_0*\Delta\theta_0 + \beta_1*\Delta\theta_1 + \ldots \beta_7*\Delta\theta_7 = \frac{0}{8}*2\pi + \beta(\Delta\theta_0 + \Delta\theta_1 \ldots \Delta\theta_7)$ $\Delta\theta_{out(PS\_sel=1)} =$
$\frac{1}{8}*2\pi + \beta_0*\Delta\theta_1 + \beta_1*\Delta\theta_2 + \ldots \beta_7*\Delta\theta_0 = \frac{1}{8}*2\pi + \beta(\Delta\theta_0 + \Delta\theta_1 \ldots \Delta\theta_7)$

…

$\Delta\theta_{out(PS\_sel=7)} =$
$\frac{7}{8}*2\pi + \beta_0*\Delta\theta_1 + \beta_1*\Delta\theta_7 + \ldots \beta_7*\Delta\theta_6 = \frac{7}{8}*2\pi + \beta(\Delta\theta_0 + \Delta\theta_1 \ldots \Delta\theta_7)$ assuming $\beta = \beta_0 = \beta_1 = \ldots \beta_7.$ Because the combination of input phase skew becomes a common term at the output, the phase delay INL ($\Delta\theta_1$-$\Delta\theta_7$) due to the phase skew averages out to approximately zero.

Figure 10:
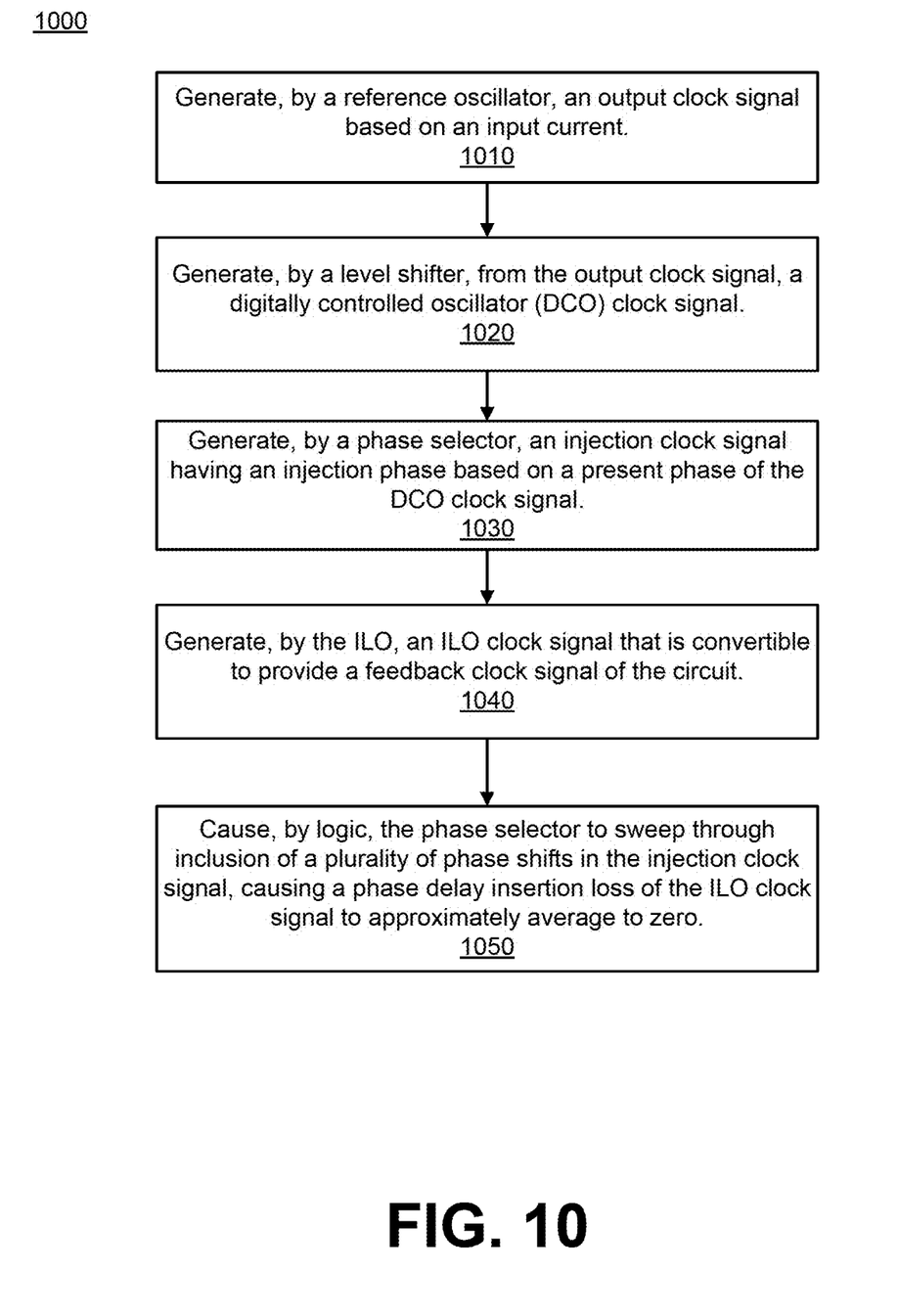
FIG. 10 is a flow chart of an example method for operating asynchronous control of phase shift using an injection-locked-oscillator-based phase rotator according to at least another embodiment.

FIG. 10 is a flow chart of an example method 1000 for operating asynchronous control of phase shift using an injection-locked-oscillator-based phase rotator according to at least another embodiment. The method 1000 can be performed by components of a timing circuit such as the circuit 100 of FIG. 1. Further, these components could be or include those of a phase-locking feedback loop of the circuit 100, at least a portion of which is discussed with reference to the circuit 300 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, the method includes generating, by a reference oscillator, an output signal based on an input current.

At operation 1020, the method includes generating, by a level shifter, from the output clock signal, a digitally controlled oscillator (DCO) clock signal.

At operation 1030, the method includes generating, by a phase selector, an injection clock signal having an injection phase based on a present phase of the DCO clock signal.

At operation 1040, the method includes generating, by an injection-locked oscillator (ILO), an ILO clock signal that is convertible to provide a feedback clock signal of the circuit.

At operation 1050, the method includes causing, by logic (e.g., processing or control logic), the phase selector to sweep through inclusion of a plurality of phase shifts in the injection clock signal, causing a phase delay INL of the ILO clock signal to approximately average to zero.

Other variations are within the scope of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein, and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to actions and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously, or intermittently. In at least one embodiment, the terms "system" and "method" are used herein interchangeably insofar as the system may embody one or more methods, and methods may be considered a system.

In the present document, references may be made to obtaining, acquiring, receiving, or inputting analog or digital data into a sub-system, computer system, or computer-implemented machine. In at least one embodiment, the process of obtaining, acquiring, receiving, or inputting analog and digital data can be accomplished in a variety of ways, such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface, or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that the subject matter claimed in appended claims is not necessarily limited to specific features or acts described. Rather, specific features and acts are disclosed as exemplary forms of implementing the claims.

What is claimed is:

1. A circuit comprising:
   a phase selector configured to generate an injection clock signal having an injection phase based on a present phase of a digitally controlled oscillator (DCO) clock signal generated within a phase-locking feedback loop;
   an injection-locked oscillator (ILO) coupled to an output of the phase selector, wherein the ILO is to generate an ILO clock signal; and
   logic coupled between an output of the ILO and the phase selector, the logic to, at each predetermined number of cycles of the DCO clock signal, cause the phase selector to output a phase shift in the injection clock signal that causes the ILO clock signal to comprise a rotated phase, relative to the injection phase.

2. The circuit of claim 1, wherein causing the phase selector to output the phase shift in the injection clock signal further prevents a glitch in the injection clock signal.

3. The circuit of claim 1, wherein the logic comprises a finite state machine configured to change, at each of the predetermined number of cycles of the DCO clock signal, a phase selection signal value provided to the phase selector that causes a percentage phase shift in a clock period of the injection clock signal.

4. The circuit of claim 1, wherein the phase selector comprises a multiplexer to map a plurality of input states, corresponding to a plurality of phases of the DCO clock signal, to a plurality of output states corresponding to injection phases of the injection clock signal, wherein a mapped output state of the plurality of output states causes the ILO to output the ILO clock signal with the rotated phase comprising one or more discrete time shifts.

5. The circuit of claim 4, wherein the plurality of phases comprise eight phases and each discrete time shift comprises an eighth of a clock period of the DCO clock signal.

6. The circuit of claim 4, wherein the plurality of phases comprise sixteen phases and each discrete time shift comprises a sixteenth of a clock period of the DCO clock signal.

7. The circuit of claim 1, further comprising a tri-state inverter coupled between the phase selector and the ILO, the tri-state inverter to adjust an injection strength of the injection clock signal before being injected into the ILO.

8. The circuit of claim 1, wherein the ILO clock signal is convertible to provide a feedback clock signal of the circuit.

9. The circuit of claim 8, further comprising:
a level shifter coupled to an output of the ILO, the level shifter to convert the ILO clock signal to a voltage domain of the feedback clock signal; and
a clock divider coupled to an output of the level shifter, wherein the clock divider is to generate the feedback clock signal from the ILO clock signal.

10. The circuit of claim 8, further comprising:
a digital-to-time converter (DTC) to receive a reference input clock signal;
a phase detector to receive and compare phases of an output of the DTC and the feedback clock signal, the phase detector to further output an error signal;
current-generating circuitry to generate a current based on the error signal; and
a reference oscillator that generates an output clock signal based on the current, wherein changes to phase of the output clock signal due to changes in the reference input clock signal are smaller than an amount of the rotated phase imparted to the ILO clock signal.

11. A circuit comprising:
a reference oscillator that generates an output clock signal based on an input current;
a level shifter coupled to the reference oscillator and to generate, from the output clock signal, a digitally controlled oscillator (DCO) clock signal;
a phase selector coupled to the level shifter and configured to generate an injection clock signal having an injection phase based on a present phase of the DCO clock signal;
an injection-locked oscillator (ILO) coupled to an output of the phase selector, wherein the ILO is to generate an ILO clock signal that is convertible to provide a feedback clock signal of the circuit; and
logic coupled between an output of the ILO and the phase selector, the logic to cause the phase selector to sweep through inclusion of a plurality of phase shifts in the injection clock signal, causing a phase delay integral non-linearity (INL) of the ILO clock signal to approximately average to zero.

12. The circuit of claim 11, further comprising:
a level shifter coupled to an output of the ILO, the level shifter to convert the ILO clock signal to a voltage domain of the feedback clock signal; and
a clock divider coupled to the level shifter, wherein the clock divider is to generate the feedback clock signal from the ILO clock signal, and wherein the logic is further to provide a divide number to the clock divider that varies with a state corresponding to a selected phase shift of the plurality of phase shifts.

13. The circuit of claim 11, further comprising:
a digital-to-time converter (DTC) to receive a reference input clock signal;
a phase detector to receive and compare phases of an output of the DTC and the feedback clock signal, the phase detector to further output an error signal; and
current-generating circuitry to generate the input current based on the error signal, wherein changes to phase of the output clock signal due to changes in the reference input clock signal are smaller than an amount of each respective phase shift imparted, of the plurality of phase shifts, to the ILO clock signal.

14. The circuit of claim 11, wherein the phase selector comprises a multiplexer to map a plurality of input states, corresponding to a plurality of phases of the DCO clock signal, to a plurality of output states corresponding to injection phases of the injection clock signal, wherein a mapped output state of the plurality of output states causes the ILO to output the ILO clock signal with a rotated phase comprising one or more discrete time shifts.

15. The circuit of claim 14, wherein the plurality of phases comprise N phases and each discrete time shift comprises an Nth of a clock period of the DCO clock signal.

16. The circuit of claim 14, wherein the logic comprises a finite state machine configured to change, every predetermined number of cycles of the DCO clock signal, a phase shift selector input provided to the multiplexer that causes a percentage phase shift in a clock period of the injection clock signal.

17. The circuit of claim 11, further comprising a pair of inverters coupled between the level shifter and the phase selector.

18. The circuit of claim 11, further comprising a tri-state inverter coupled between the phase selector and the ILO, the tri-state inverter to adjust an injection strength of the injection clock signal before being injected into the ILO.

19. A method of operating a circuit comprising a phase selector coupled to an injection-locked oscillator (ILO) and logic coupled between the phase selector and the ILO, wherein the method of operating the circuit comprises:
injecting, by the phase selector into the ILO, an injection clock signal having an injection phase based on a present phase of a digitally controlled oscillator (DCO) clock signal generated within a phase-locking feedback loop;
generating, by the ILO, an ILO clock signal; and
causing, by the logic, at each predetermined number of cycles of the DCO clock signal, the phase selector to output a phase shift in the injection clock signal that causes the ILO clock signal to comprise a rotated phase, relative to the injection phase.

20. The method of claim 19, wherein the phase selector comprises a multiplexer that maps a plurality of input states, corresponding to a plurality of phases of the DCO clock signal, to a plurality of output states corresponding to injection phases of the injection clock signal, and wherein the method of operating the circuit further comprises changing, at each of the predetermined number of cycles of the DCO clock signal, a phase shift selector input provided to the multiplexer that causes a percentage phase shift in a clock period of the injection clock signal.

21. The method of claim 20, wherein the plurality of phases comprise N phases and each discrete time shift comprises an Nth of a clock period of the DCO clock signal.

22. The method of claim 19, wherein the circuit further comprises a tri-state inverter coupled between the phase selector and the ILO, and wherein the method of operating the circuit further comprises adjusting, by the tri-state inverter, an injection strength of the injection clock signal before being injected into the ILO.

23. The method of claim 19, wherein causing the phase selector to output the phase shift in the injection clock signal further prevents a glitch in the injection clock signal.

\* \* \* \* \*